(12) United States Patent
Iizuka

(10) Patent No.: US 8,008,946 B2
(45) Date of Patent: Aug. 30, 2011

(54) SEMICONDUCTOR INTEGRATED CIRCUIT

(75) Inventor: Mariko Iizuka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 123 days.

(21) Appl. No.: 12/533,573

(22) Filed: Jul. 31, 2009

(65) Prior Publication Data

US 2010/0026347 A1    Feb. 4, 2010

(30) Foreign Application Priority Data

Aug. 1, 2008   (JP) ................................. 2008-199131

(51) Int. Cl.
  *G01R 25/00*   (2006.01)
  *H03D 13/00*   (2006.01)

(52) U.S. Cl. .................... 327/3; 327/2; 327/12; 327/172

(58) Field of Classification Search .................. 327/2, 3, 327/172, 291

See application file for complete search history.

(56) References Cited

U.S. PATENT DOCUMENTS

| 7,049,867 B2 * | 5/2006 | Kinugasa et al. ............. 327/157 |
| 2006/0087346 A1 * | 4/2006 | Ishida et al. ..................... 327/3 |

FOREIGN PATENT DOCUMENTS

| JP | 52-149949 A | 12/1977 |
| JP | 63-6329 Y | 1/1988 |
| JP | 03-224020 A | 10/1991 |
| JP | 05-259846 A | 10/1993 |
| JP | 06-163827 A | 6/1994 |
| JP | 06-350439 A | 12/1994 |
| JP | 07-177004 A | 7/1995 |
| JP | 11194848 | 7/1999 |
| JP | 11-355107 A | 12/1999 |
| JP | 2000-278103 A | 10/2000 |

OTHER PUBLICATIONS

Japanese Office Action for 2008-199131 mailed on Dec. 7, 2010.

* cited by examiner

*Primary Examiner* — Lincoln Donovan
*Assistant Examiner* — John W Poos
(74) *Attorney, Agent, or Firm* — Turocy & Watson, LLP

(57) ABSTRACT

A first counter detects a rising edge of a clock signal, and generates a first signal having a multiplied cycle of the clock signal.

A second counter detects a falling edge of the clock signal, and generates a second signal having a multiplied cycle of the clock signal. A first line transfers the first signal, while a second line transfers the second signal. A phase comparator is connected to the first line and the second line to generate a third signal based on a phase difference between the first signal and the second signal and output the third signal to one of the circuit units.

A plurality of the phase comparators are connected to the first line and the second line, and are disposed between one of the ends of the first line and the second line and one of the circuit units.

6 Claims, 3 Drawing Sheets

SEMICONDUCTOR INTEGRATED CIRCUIT

CROSS REFERENCE TO RELATED APPLICATIONS

This application is based on and claims the benefit of priority from prior Japanese Patent Application No. 2008-199131, filed on, Aug. 1, 2008, the entire contents of which are incorporated herein by reference.

BACKGROUND OF THE INVENTION

1. Field of the Invention

The present invention relates to a semiconductor integrated circuit, and more particularly, to a semiconductor integrated circuit having a clock signal generation circuit.

2. Description of the Related Art

In a semiconductor integrated circuit, dispersion in delay time of the clock signal may occur among plurality of wiring lines, because of changes in phase, duty cycle or the like of the clock signal. This might cause an error in functions of various circuits. Therefore, in a known method (JP H11-194848A), buffers are arranged on the clock signal lines in a tree-like form (referred to as a clock tree hereinbelow) to equalize delay time of the clock signal at circuits to which the clock signal is supplied.

However, when a clock tree with the large number of hierarchy is formed, a logic delay occurs to a cell positioned at the terminal of the clock tree, and access time deteriorates. In addition, since the clock tree structure may increase the area of the semiconductor integrated circuit because it needs buffers therein. Since the conventional art has the above-mentioned problem, it is difficult to provide a small semiconductor integrated circuit with a tolerance against changes in phase, duty cycle or the like of the clock signal.

SUMMARY OF THE INVENTION

The semiconductor integrated circuit according to one aspect of the present invention comprises: a plurality of circuit units arranged therein; a first counter configured to detect a rising edge of a clock signal and generate a first signal having a multiplied cycle of the clock signal; a second counter configured to detect a falling edge of the clock signal and generate a second signal having a multiplied cycle of the clock signal; a first line for transferring the first signal; a second line for transferring the second signal; and a phase comparator connected to the first line and the second line to generate a third signal based on a phase difference between the first signal and the second signal and output the third signal to one of the circuit units, the phase comparator being disposed on the first line and the second line, and plurality of the phase comparators being disposed between ends of the first line and the second line and the circuit units.

DETAILED DESCRIPTION OF THE EMBODIMENTS

Next, a semiconductor integrated circuit according to the present embodiment of the present invention is described with reference to drawings.

Structure of Semiconductor Integrated Circuit of Embodiment

Figure 1:
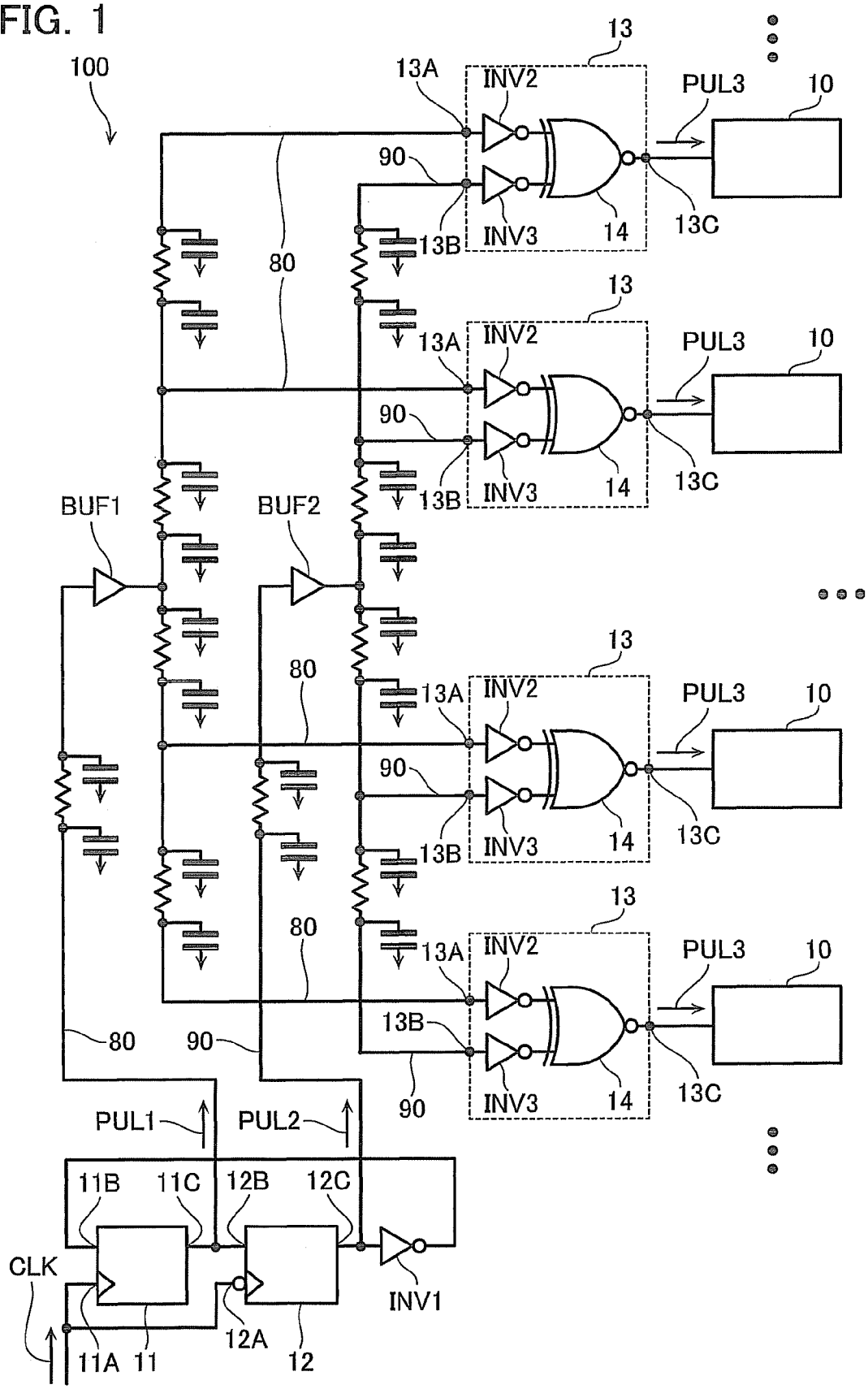
FIG. 1 illustrates a structure of the semiconductor integrated circuit 100 according to an embodiment of the present invention.

FIG. 1 schematically illustrates the semiconductor integrated circuit 100 according to the embodiment. As shown in FIG. 1, the semiconductor integrated circuit 100 according to the present embodiment mainly comprises a plurality of circuit units 10, a first counter 11, a second counter 12, inverters INV, buffers BUF, and phase comparators 13.

The circuit units 10 each may be a microcomputer, a memory or the like. Plural circuit units 10 are disposed in the semiconductor integrated circuit 100. In FIG. 1, four circuit units 10 are arranged in the semiconductor integrated circuit 100, but the present invention is not limited to the specific number.

The first counter 11 has a clock terminal 11A, data input terminal 11B, and a data output terminal 11C. The first counter 11 receives a clock signal CLK as an input at the clock terminal 11A. When the first counter 11 detects a rising edge of the clock signal CLK, it outputs a first signal PUL1 from the data output terminal 11C. The first signal PUL1 has a multiplied cycle (ex. double) of the clock signal CLK.

The second counter 12 has a clock terminal 12A, a data input terminal 12B, and a data output terminal 12C. The second counter 12 receives a clock signal CLK as an input at the clock terminal 12A. When the second counter 11 detects a falling edge of the clock signal CLK, it outputs a second signal PUL2 from the data output terminal 12C. The second signal PUL2 has a multiplied cycle (ex. double) of the clock signal CLK.

The output terminal 11C of the first counter 11 is connected to the input terminal 12B of the second counter 12. Moreover, the output terminal 12C of the second counter 12 is connected to the input terminal 11A of the first counter 11 via the inverter INV1.

The phase comparator 13 has a first data input terminal 13A, a second data input terminal 13B, and a data output terminal 13C. The data input terminal 13A is connected to the output terminal 11C of the first counter 11, while the data input terminal 13B is connected to the output terminal 12C of the second counter 12. Contrary to the above-described connection, it is also possible that the data input terminal 13A is connected to the output terminal 12C, and the data input terminal 13B is connected to the output terminal 11C. Note that in the example explained below, the data input terminal 13A is connected to the output terminal 11C of the first counter 11, and the data input terminal 13B is connected to the output terminal 12C of the second counter 12.

The first output terminal 11C of the first counter 11 and the data input terminal 13A of the phase comparator 13 are connected via a first line 80. The second output terminal 12C of the second counter 12 and the data input terminal 13B of the phase comparator 13 are connected via a second line 90. Therefore, a first signal PUL1 is transferred through the first line 80, while the second signal PUL2 is transferred through the second line 90.

Depending on the situation, the first line 80 and the second line 90 may be provided with a buffer BUF arranged thereon. In this embodiment, a buffer BUF1 is disposed on the first line 80, and a buffer BUF2 is disposed on the second line 90. The number of the buffers BUF, however, is not limited to the specific number shown in FIG. 1.

The phase comparator 13 receives the first signal PUL1 and the second signal PUL2, and generates a third signal PUL3 based on a phase difference between the first signal PUL1 and the second signal PUL2. The third signal PUL3 is output from the output terminal 13C.

The plural phase comparators 13 are provided for respective circuit units 10, and disposed between ends of the first line 80 and second line 90 and the circuit units 10. Therefore, the first line 80 branches off into plural branches from the first counter 11. Each of the plural branches is connected to a data input terminal 13A of the phase comparator 13. Similarly, the second line 90 branches off into plural branches from the second counter 12. Each of the plural branches is connected to a data input terminal 13B of the phase comparator 13. Note that, in FIG. 1, the number of the phase comparators 13 is four, the number being in accordance with that of the circuit units 10 in FIG. 1. However, the invention is not limited to the number or the relationship shown in FIG. 1.

The phase comparator 13 is formed of an EX-OR gate (an Exclusive OR gate). Alternatively, it may includes inverters INV provided at the input terminals of the EX-NOR gate. In this embodiment, the phase comparator 13 includes a first inverter INV2 (a first inverter), a second inverter INV3 (a second inverter) and an EX-NOR gate 14 (referred to as a comparator 14 hereinbelow). Therefore, the input terminals 13A, 13B of the phase comparator 13 are connected to the input terminals of inverters INV2, INV3, respectively. Moreover, the output terminal 13C of the phase comparator 13 is connected to an output terminal of the comparator 14.

The inverter INV2 receives the first signal PUL1 and outputs an inverted signal REV1 (a first inverted signal) of the first signal PUL1 to the comparator 14.

The inverter INV3 receives the second signal PUL2 and outputs an inverted signal REV2 (a second inverted signal) of the second signal PUL2 to the comparator 14.

The comparator 14 receives the inverted signals REV1 and REV2, and generates, based on these signals, a third signal PUL3 indicating a phase difference between the inverted signal REV1 and the inverted signal REV2. The third signal PUL2 is output to the circuit unit 10.

As described above, the phase comparator 13 is disposed between the ends of the first line 80 and the second line 90 and the circuit units 10. Therefore, the first line 80 and the second line 90 are designed so that they have a larger wiring lengths than wiring lines disposed between the phase comparators 13 and the circuit units 10, and wiring lines for transferring the clock signal CLK to be supplied to the first counter 11 and the second counter 12. One of the feature of the present embodiment resides in this.

The reason why the first line 80 and second line 90 have such large wiring lengths is described hereinbelow. The clock signal CLK swings at a higher frequency (double, for example) than other signals (address signals, data signals, or the like, not illustrated) Therefore, it is more likely to suffer, compared to the other signals, a signal distortion thereof due to the wiring line resistance of the transmission line or the stray capacitance thereof (hereinafter referred to as a wiring time constant). Therefore, when the wiring time constant is too large, the clock signal CLK does not swing enough, and the device ends up in operation failure.

Therefore, it is necessary for the lines for transferring the clock signal CLK, the first signal PUL1, the second signal PUL2, the first inverted signal REV1, the second inverted signal REV2 and the third signal PUL3 to be formed to have a smaller wiring time constant than the lines for transferring other signals such as address signals or data signals. For example, each of the lines for transferring the above-mentioned signals is formed to have a wiring time constant that is less than the half cycle of these signals.

However, as described above, the semiconductor integrated circuit 100 according to the present embodiment is configured so that the first counter 11 and the second counter 12 convert the clock signal CLK into the first signal PUL1 and the second signal PUL2 having a multiplied cycle of the clock signal CLK. Since the first signal PUL1 and the second signal PUL2 have a smaller frequency than the clock signal CLK, waveform distortion due to the wiring time constant is relatively small, and it does not greatly affect the operation of the clock signal CLK. As described above, it is possible to employ a design where the first line and the second line for transferring the first signal PUL1 and the second signal PUL2 have large wiring lengths.

However, it is not appropriate that the inverter INV2 and the inverter INV3 formed on the first line 80 and the second line 90 are located at the respective positions where the wiring time constant thereof are different from each other. This is because this may vary the phases of the inverted signals REV1 and REV2 generated at the inverters 2 and 3. When the phases of the inverted signals REV1 and REV2 vary, it may vary the duty cycle of the third signal PUL3 generated based on the phase difference between the inverted signals REV1 and REV2. Then, the third signal PUL3 having a duty cycle different from that of the clock signal CLK is transferred to each of the circuit units 10. This leads to an operation error in the circuit units 1. Therefore, the inverter INV2 and the inverter INV3 are disposed at the respective positions where wiring time constants of the first line 80 and the second line 90 are equal.

Note that resistors and capacitors illustrated on the first line 80 and the second line 90 do not mean devices actually disposed thereon as real elements, but means wiring resistances and stray capacitances included in the first line 80 and second line 90.

With the structure of this embodiment, signals may be transferred to each circuit without varying a clock frequency or a duty cycle thereof due to a wiring time constant of the transfer line, even if a high clock frequency and a high duty ratio is used. Moreover, the number of buffers disposed on the clock transfer lines may be smaller. This may reduce the area of the semiconductor integrated circuit 100.

Operation of Semiconductor Integrated Circuit 100 According to First Embodiment

Figure 2:
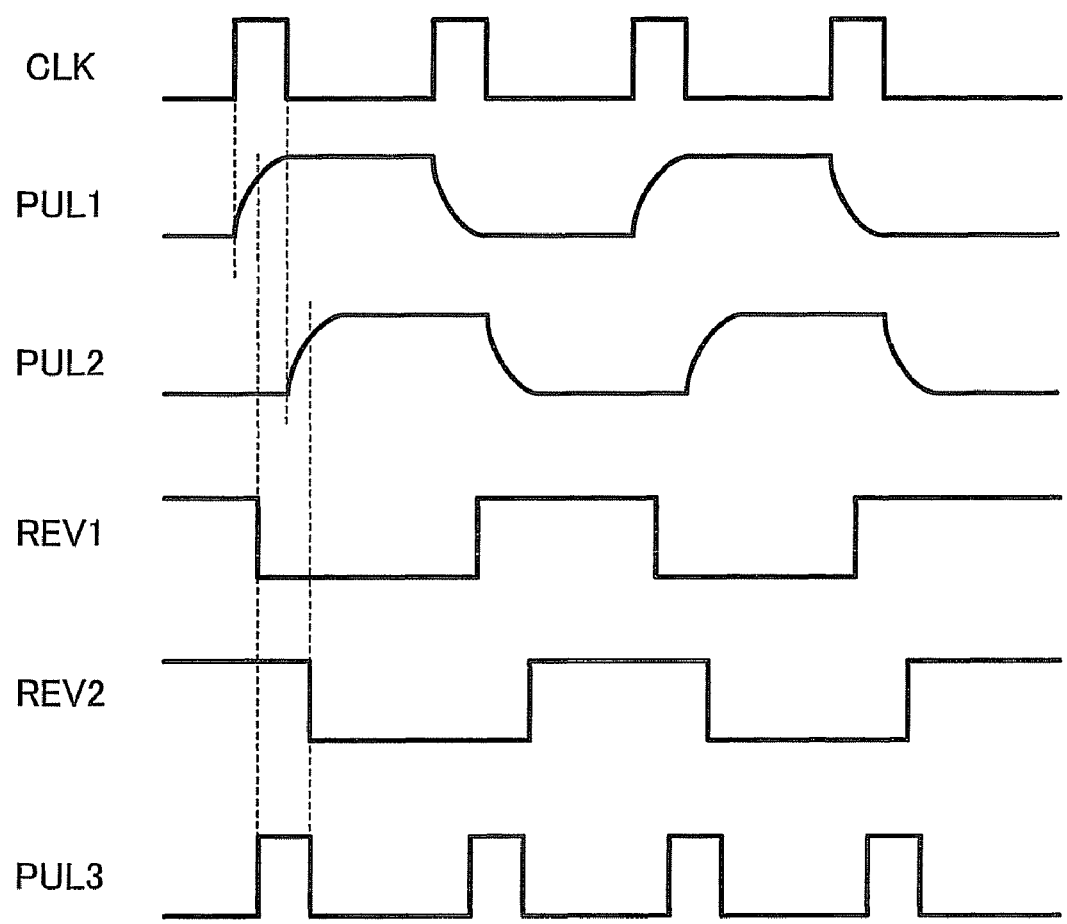
FIG. 2 is a graph showing states of the clock signal CLK in each part when the clock signal CLK is transferred in the semiconductor integrated circuit 100.

Next, an operation of the semiconductor integrated circuit 100 according to the first embodiment is described with reference to FIG. 2. FIG. 2 is a timing chart illustrating the states of the signals in each part when the clock signal CLK is transferred to the circuit units 10.

The clock signal CLK is transferred to a first clock terminal 11A of the counter 11 and to the clock terminal 12A of the second counter 12. The first counter 11 generates the first signal PUL1 from the rising edge of the clock signal CLK, and the first signal PUL1 is output into the first line 80 from the data output terminal 11C. The second counter 12 generates the second signal PUL2 from the falling edge of the clock signal CLK, and the second signal PUL2 is output into the second line 90 from the data output terminal 12C.

The first signal PUL1 and the second signal PUL2 are generated to have a multiplied cycle of the clock signal CLK(a doubled cycle, for example). Therefore, as shown in FIG. 2, one cycle of the first signal PUL1 and the second signal PUL2 are generated for two cycles of the clock signal CLK.

In the semiconductor integrated circuit 100 according to this embodiment, the first line 80 and the second line 90 may have larger wiring lengths compared to the other lines. Therefore, a wiring time constant thereof becomes higher. Accordingly, the first signal PUL1 and the second signal PUL2 transmitting in the first line 80 and the second line 90 has distorted waveforms due to the wiring time constant as shown in FIG. 2.

The inverter INV2 generates the first inverted signal REV1 by inverting the first signal PUL1, and outputs the first inverted signal REV1 to the comparator 14. The inverter INV3 generates the second inverted signal REV2 by inverting the second signal PUL2, and outputs the second inverted signal REV2 to the comparator 14.

The comparator 14 generates the third signal PUL3 from a phase difference of the first inverted signal REV1 and the second inverted signal REV2, and output it to the circuit unit 10.

The inverter INV2 and the inverter INV3 are disposed at the respective positions where wiring time constants of the first line 80 and the second line 90 are equal. Therefore, the threshold voltage of the inverter INV2 and the inverter INV3 are set equal. This enables the phase difference between the first inverted signal REV1 and second inverted signal REV2 to be substantially equal to that between the first signal PUL1 and the second signal PUL2. Then, the third signal PUL3 having substantially the same frequency and substantially the same duty cycle as the clock signal CLK is transferred from the comparator 14 to the circuit unit 10.

Figure 3:
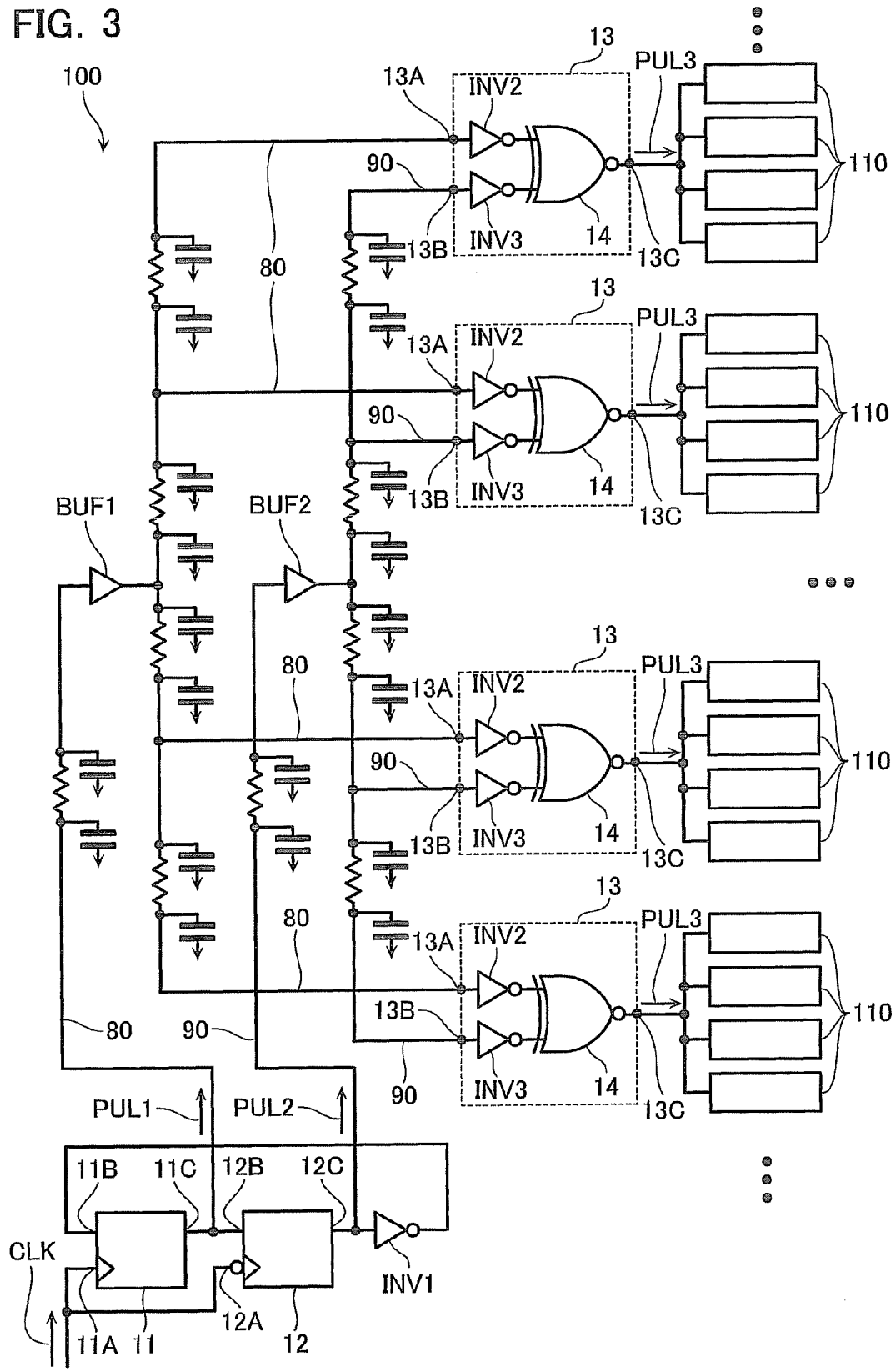
FIG. 3 illustrates another structure of the circuit unit 10.

Having explained the embodiment of the present invention, the present invention is not limited to the specific embodiment. Various changes, addition, substitution is possible in the present embodiment without departing the spirit or the scope of the invention. For example, in the embodiment described above, the clock signal CLK is transferred to the circuit units 10 such as a microcomputer or a memory. The Clock signal CLK may be transferred to a memory cell array, as shown in FIG. 3. Any semiconductor integrated circuits in which a clock signal CLK is transferred are included in the scope of the present invention, regardless of the size of the semiconductor integrated circuit 100.

Moreover, in the above-described embodiment, the first counter 11 and the second counter 12 is formed with a flip-flop. They may be formed of a combination of logic gates, as far as he same operation may be performed.

What is claimed is:

1. A semiconductor integrated circuit, comprising:
   a plurality of circuit units arranged therein;
   a first counter configured to detect a rising edge of a clock signal and generate a first signal having a multiplied cycle of the clock signal;
   a second counter configured to detect a falling edge of the clock signal and generate a second signal having a multiplied cycle of the clock signal;
   a first line for transferring the first signal;
   a second line for transferring the second signal; and
   a phase comparator connected to the first line and the second line to generate a third signal based on a phase difference between the first signal and the second signal and output the third signal to one of the circuit units,
   the phase comparator being disposed on the first line and the second line, and plurality of the phase comparators being disposed between ends of the first line and the second line and the circuit units, wherein
   the wiring time constant of the first line and the wiring time constant of the second line are less than half of the cycles of the first signal and the second signal transferred on the first line and the second line.

2. The semiconductor integrated circuit according to claim 1, wherein the phase comparator comprises:
   a first inverter connected to the first line and configured to generate a first inverted signal as a inverted signal of the first signal;
   a second inverter connected to the second line and configured to generate a second inverted signal as a reversed signal of the second signal; and
   a comparator connected to the first inverter and the second inverter to generate the third signal based on a phase difference between the first inverted signal and the second inverted signal.

3. The semiconductor integrated circuit according to claim 2, wherein the first inverter and the second inverter are disposed at positions so that the wiring time constant of the first line and the wiring time constant of the second line are equal.

4. The semiconductor integrated circuit according to claim 1, wherein a buffer is provided on the first line and the second line.

5. A semiconductor integrated circuit, comprising:
   a plurality of circuit units arranged therein;
   a first counter configured to detect a rising edge of a clock signal and generate a first signal having a multiplied cycle of the clock signal;
   a second counter configured to detect a falling edge of the clock signal and generate a second signal having a multiplied cycle of the clock signal;
   a first line for transferring the first signal;
   a second line for transferring the second signal; and
   a phase comparator connected to the first line and the second line to generate a third signal based on a phase difference between the first signal and the second signal and output the third signal to one of the circuit units,
   the phase comparator being disposed on the first line and the second line, and plurality of the phase comparators being disposed between ends of the first line and the second line and the circuit units,
   wherein the first inverter and the second inverter are disposed at positions so that the wiring time constant of the first line and the wiring time constant of the second line are equal, and
   the wiring time constant of the first line and the wiring time constant of the second line are less than half of the cycles of the first signal and the second signal transferred on the first line and the second line.

6. The semiconductor integrated circuit according to claim 5, wherein a buffer is provided on the first line and the second line.

* * * * *